United States Patent
Paranjpe et al.

(10) Patent No.: US 6,294,836 B1
(45) Date of Patent: Sep. 25, 2001

(54) SEMICONDUCTOR CHIP INTERCONNECT BARRIER MATERIAL AND FABRICATION METHOD

(75) Inventors: Ajit P. Paranjpe, Sunnyvale; Mehrdad M. Moslehi, Los Altos; Randhir S. Bubber; Lino A. Velo, both of San Ramon, all of CA (US)

(73) Assignee: CVC Products Inc., Rochester, NY (US)

( * ) Notice: Subject to any disclaimer, the term of this patent is extended or adjusted under 35 U.S.C. 154(b) by 0 days.

(21) Appl. No.: 09/219,147

(22) Filed: Dec. 22, 1998

(51) Int. Cl.[7] .................................................. H01L 23/48
(52) U.S. Cl. ........................ 257/767; 257/758; 257/761; 257/763
(58) Field of Search ................................. 757/758, 761, 757/763, 767

(56) References Cited

U.S. PATENT DOCUMENTS

| | | | |
|---|---|---|---|
| 4,789,598 | 12/1988 | Howard et al. | 428/408 |
| 4,948,623 | 8/1990 | Beach et al. | 427/35 |
| 4,965,656 | 10/1990 | Koubuchi et al. | 357/71 |
| 4,970,093 | * 11/1990 | Sievers et al. | 427/38 |
| 5,082,542 | * 1/1992 | Moslehi et al. | 204/192.32 |
| 5,085,731 | 2/1992 | Norman et al. | 156/646 |
| 5,098,516 | 3/1992 | Normal et al. | 156/666 |
| 5,112,448 | 5/1992 | Chakravorty | 205/118 |
| 5,231,751 | 8/1993 | Sachdev et al. | 29/852 |
| 5,312,509 | 5/1994 | Eschbach | 156/345 |
| 5,354,712 | 10/1994 | Ho et al. | 437/195 |
| 5,453,124 | * 9/1995 | Moslehi et al. | 118/715 |
| 5,464,656 | * 11/1995 | Verkade | 427/248.1 |
| 5,594,278 | 1/1997 | Uchiyama | 257/751 |
| 5,674,787 | 10/1997 | Zhao et al. | 437/230 |
| 5,723,028 | 3/1998 | Poris | 204/231 |
| 5,736,191 | 4/1998 | Biernath | 427/96 |
| 5,763,953 | 6/1998 | Iijima et al. | 257/762 |
| 5,789,321 | 8/1998 | Ohshita | 438/680 |
| 5,792,593 | * 8/1998 | McClure et al. | 430/314 |
| 5,824,590 | * 10/1998 | New | 438/393 |
| 5,843,516 | * 12/1998 | Derbenwick et al. | 427/96 |

(List continued on next page.)

FOREIGN PATENT DOCUMENTS

| | | | |
|---|---|---|---|
| 0 093 971A2 | 4/1983 | (EP) | H01L/29/40 |
| 0 297 348 A1 | 1/1989 | (EP) | C23C/16/18 |
| 0698918 A1 | 2/1996 | (EP) | H01L/21/3205 |
| 0 725 439 A2 | 8/1996 | (EP) | H01L/23/532 |
| 0 881 673 A2 | 12/1998 | (EP) | H01L/21/768 |

OTHER PUBLICATIONS

Written Opinion for PCT application No. US99/30662, Nov. 27, 2000.

(List continued on next page.)

Primary Examiner—Steven Loke
Assistant Examiner—Douglas W. Owens
(74) Attorney, Agent, or Firm—Baker Botts L.L.P.

(57) ABSTRACT

A microelectronic semiconductor interconnect structure barrier and method of deposition provide improved conductive barrier material properties for high-performance device interconnects. The barrier comprises a dopant selected from the group consisting of platinum, palladium, iridium, rhodium, and tin. The barrier can comprise a refractory metal selected from the group consisting of tantalum, tungsten titanium, chromium, and cobalt, and can also comprise a third element selected from the group consisting of carbon, oxygen and nitrogen. The dopant and other barrier materials can be deposited by chemical-vapor deposition to achieve good step coverage and a relatively conformal thin film with a good nucleation surface for subsequent metallization such as copper metallization in one embodiment, the barrier suppresses diffusion of copper into other layers of the device, including the inter-metal dielectric, pre-metal dielectric, and transistor structures.

14 Claims, 1 Drawing Sheet

U.S. PATENT DOCUMENTS

| | | | |
|---|---|---|---|
| 5,852,088 | * 12/1998 | Dismukes et al. | 524/175 |
| 5,866,237 | 2/1999 | Angelopoulos | 428/209 |
| 5,891,348 | * 4/1999 | Ye et al. | 216/67 |
| 5,891,513 | * 4/1999 | Dubin et al. | 427/98 |
| 5,916,359 | * 6/1999 | Baum et al. | 106/287 |
| 5,948,467 | 9/1999 | Nguyen et al. | 427/99 |
| 6,015,917 | * 1/2000 | Bhandari et al. | 556/12 |

OTHER PUBLICATIONS

Ivanova, et al., "The Effects of Processing Parameters in the Chemical Vapor Deposition of Cobalt from Cobalt Tricarbonyl Nitrosyl," Journal of The Electrochemical Society, vol. 146, pp. 2139–2145, revised Dec. 22, 1998, Jun. 1999.

English language translation of Abstract from Japanese Patent application No. 10242409; Class H01L 27/Subclass 10, Apr. 30, 1997.

English language translation of Abstract from Japanese Patent application No. 10092977; Class H01L 23/Subclass 14, Mar. 4, 1997.

English language translation of Abstract from Japanese Patent Application No. 06203379; Class G11B 5/Subclass 85, Jul. 22, 94.

English language translation of Abstract from Japanese Patent Application 07057312; Class G11B/Subclass 11, Mar. 3, 1995.

XP000555612 Paranjpe, et al., "Chemical vapor deposition TiN process for contact/via barrier applications" Journal of Vacuum Science and Technology: Part B, U.S., American Institute of Physics, New York, Sep. 1, 1995.

Xp000531565 Eizenberg, et al., "Chemical vapor deposited TiCN: A new barrier metallization for submicron via and contact applications," Journal of Vacuum Science and technology: Part A, U.S., American Institute of Physics, New York, May 1, 1995.

Cote, et al. "An Evaluation of Cu Wiring in a Production 64Mb DRAM," IBM Semiconductor Research and Development Center, IBM Microelectronics Division, Hopewell Junction, NY, 1998 Symposium on VLSI Technology Digest of Technical Papers, pp. 24–25, Jun. 1998.

Woo, et al. "A High Performance 3.97 $\mu^2$ CMOS SRAM Technology Using Self–Aligned Local Interconnect and Copper Interconnect Metalization," Networking and Computing Systems Group, Process Technology Development, Motorola Inc., Austin, TX, 1998 Symposium on VLSI Technology Digest of Technical Papers, pp. 12–13, Jun. 1998.

Zhao, et al. "A Cu/Low–k Dual Damascene Interconnect for High Performance and Low Cost Integrated Circuits" Rockwell Semiconductor Systems, 4311 Jamboree Road, Newport Beach CA, 1998 Symposium on VLSI Technology Digest of Technical Papers, pp. 28–29, Jun. 1998.

Schulz, et al. "A High–Performance Sub–0.25 $\mu$m CMOS Technology with Multiple Thresholds and Copper Interconncects" IBM Semiconductor Research and Development Center, Hopewell Junction, NY, 1998 Symposium on VLSI Technology Digest of Technical Papers, pp. 18–19, Jun. 1998.

Denning, et al. "An Inlaid CVD Cu Based Integration for Sub 0.25 βm Technology" Advanced Products Research and Development Laboratory, Motorola, 3501 Ed Bluestein Blvd., Austin, TX, 1998 Symposium on VLSI Technology Digest of Technical Papers, pp. 22–23, Jun. 1998.

* cited by examiner

SEMICONDUCTOR CHIP INTERCONNECT BARRIER MATERIAL AND FABRICATION METHOD

TECHNICAL FIELD OF THE INVENTION

This invention relates in general to the field of electronic devices, and more particularly to an improved barrier and method for deposition of same.

BACKGROUND OF THE INVENTION

Microelectronic integrated circuit device fabrication technology has focused on techniques and materials to produce smaller and faster devices for higher performance chips. This trend towards miniaturization has led to demand for improved semiconductor integrated circuit (IC) interconnect performance and improved manufacturability, resulting in a shift from conventional Al/SiO$_2$ interconnect architectures to copper-based metallization in conjunction with low-permitivity dielectrics. Copper metallization reduces interconnect propagation delays, reduces cross-talk, and enables higher interconnect current densities with extended electromigration lifetime. When combined with low-k dielectrics, copper metallization can also decrease the number of metallization levels, resulting in reduced chip manufacturing costs. For instance, the superior electromigration performance and lower resistivity of copper compared to aluminum, permits a reduction in metal stack height that results in reduced signal cross-talk and improved interconnect speed.

A number of deposition methods, such as chemical-vapor deposition (CVD), physical-vapor deposition (PVD) and electrochemical deposition (ECD) or plating will support deposition of uniform thin-film copper layers. Chemical-vapor deposition, in particular, provides a number of advantages over other deposition techniques, including the capability for fully vacuum cluster integrated deposition of the diffusion barrier and copper layers through cluster tool equipment. Metal-organic CVD (MOCVD) is a particularly desirable means for deposition of copper due to its excellent gap-fill characteristics, such as is desirable for via holes and trenches, its excellent step coverage, its compatibility with single/dual damascene processing, and its relatively low thermal budget, such as less than 250° C., which helps ensure compatibility with low-k polymer dielectrics. Due to these advantages, as device dimensions shrink, MOCVD is likely to replace other deposition techniques as the preferred solution for deposition of uniform high-conductivity copper layers.

Although copper provides a number of advantages for microelectronic chip performance, significant difficulties exist in depositing and reliably integrating copper layers on a substrate. One difficulty relates to copper's rapid diffusion through many materials, including both metals and dielectrics. Copper tends to diffuse through device materials during the thermal cycling that a semiconductor substrate experiences during the multi-level interconnect fabrication process, as well as during actual chip operation under applied electric fields. Copper diffusion into and/or through the inter-metal dielectric (IMD) results in current leakage between adjacent metal lines, known as line-to-line leakage. Copper diffusion through the IMD and pre-metal dielectric (PMD) or inter-level dielectric (ILD) and into the transistor regions results in degraded device characteristics and, potentially, non-functional transistor devices.

Another difficulty associated with copper in microelectronic device fabrication, such as semiconductor IC fabrication, is the sufficient adhesion of the copper to the underlying barrier. Moreover, copper is prone to corrosion and must be passivated. Non-conducting diffusion barriers, such as Si$_3$N$_4$, are ideal for passivation and prevention of copper diffusion between metallization layers. However, for many applications, a conducting barrier is necessary. For instance, a conducting barrier is necessary to enable electrical current flow between via plugs and lower level metal lines. To reduce copper diffusion and corrosion, a number of advanced diffusion barriers have been developed to supplant traditional barriers used with aluminum and tungsten metallization, such as TiN and TiW barriers. For instance, some barriers proposed for use with copper metallization include Ta, TaN, WN$_x$, and ternary barriers such as TiSiN, TaSiN, WSiN, and WBN. Although these barriers improve reliability of copper metallization in microelectronic devices, these conventional barriers have some significant difficulties including poor adhesion with as deposited copper and sometimes with other adjacent layers, such as low-K dielectrics.

Other potential problems associated with copper metallization include difficulties associated with the deposition process for depositing copper and barrier layers onto the substrate. The deposition of a barrier layer using conventional barrier materials and deposition techniques may have difficulty achieving a good nucleation surface to promote <111> texture in an overlying copper layer for improved electromigration lifetime, and good step coverage in high-aspect-ratio features so that barrier thickness on the sidewall and bottom is comparable to barrier thickness in the field. In addition, conventional barrier materials and deposition techniques tend to have increased resistivity, especially as deposition temperatures are lowered to below 380° C.

SUMMARY OF THE INVENTION

Therefore, a need has arisen for a barrier material and method for deposition of the barrier which reduces or suppresses copper diffusion through device layers.

A further need exists for a barrier material and method of deposition that improves adhesion of metallization layers, including adhesion of the barrier to underlying layers and adhesion of copper metallization to the barrier layer.

A further need exists for a barrier material and method of deposition that provides low resistance of the barrier layer to electrical current flow.

A further need exists for a barrier material and method of deposition that provides improved step coverage of microelectronic devices such as a semiconductor chip, having high-aspect-ratio features.

A further need exists for a barrier material and method of deposition that supports deposition of low resistivity films at relatively low deposition temperatures.

A further need exists for a barrier material and method of deposition that reduces or eliminates copper corrosion.

In accordance with the present invention, a barrier material and method for deposition of the barrier are provided that substantially eliminate or reduce disadvantages and problems associated with previously developed diffusion barriers and methods of deposition. The barrier material comprises one or more metallic dopants selected from the group consisting of platinum, palladium, iridium, rhodium, and tin. The dopant can be combined with at least one refractory metal selected from the group consisting of tantalum, tungsten, titanium, cobalt and chromium, and can also be combined with at least one element selected from the group consisting of carbon, oxygen and nitrogen. A variety of combinations of the dopant or several dopants can be used to address particular difficulties or process integration requirements associated with various device structures. The MOCVD technique for deposition of the dopant provides a uniform thin film layer with good step coverage and nucleation surface. Co-deposition of the dopant with other materials at varied deposition rates allows manipulation of barrier material characteristics throughout the thickness of the barrier layer, allowing the dopant to have varying concentrations relative to other barrier materials at the barrier interface with overlying and underlying layers by depositing graded composition barrier layers.

The present invention provides a number of important technical advantages. One important technical advantage is the reduced diffusion of copper through the barrier material, due to the thermal budget at the fabrication processes associated with the multi-level interconnect formation and during actual device operation under an applied electric fields and possible thermal stress conditions.

Another important technical advantage is thermal stability so that the barrier material remains inert during processing and so that deposition temperatures can be reduced for compatibility with low-k dielectrics, typically having deposition temperatures of below approximately 375° C.

Another important technical advantage is good adhesion of the barrier material to the underlying surface as well as to the copper layer deposited over the barrier, such that the structured integrity of the interconnect structure is preserved through the device fabrication process flow.

Another important technical advantage is good nucleation surface to promote <111> texture in the copper layer deposited on the surface, resulting In improved electromigration reliability lifetime.

Another important technical advantage is low electrical resistivity, such as $P \leq 500$ $\mu\Omega.cm$, and contact/interface resistance to the underlying metal, such as copper, so that low via plug resistance, such as $R \leq 1.5\Omega$, can be achieved.

Another important technical advantage is good step coverage of the barrier material in high-aspect-ratio features so that barrier thickness on sidewall and bottom surfaces is comparable to barrier thickness in the field, allowing extendibility in terms of barrier thickness scaling.

BRIEF DESCRIPTION OF THE DRAWINGS

A more complete understanding of the present invention and advantages thereof may be acquired by referring to the following description, taken in conjunction with the accompanying drawings in which like reference numbers indicate like features and wherein.

DETAILED DESCRIPTION OF THE INVENTION

Preferred embodiments of the present invention are illustrated in the FIGURES, like numerals being used to refer to like and corresponding parts of the various drawings.

Chemical-vapor deposition (CVD) of barrier materials provides a uniform film with a high degree of conformality and good step coverage, as is needed to support device dimensions that continue to shrink. However, conventional CVD techniques for deposition of copper films frequently fail to meet manufacturing standards due to poor adhesion of the copper layer to the barrier film. Further, conventional CVD deposition techniques of barrier films result in relatively high electrical resistivity (e.g., $P > 2000$ $\mu\Omega.cm$) films as the deposition temperature is reduced to below 380° C. for compatibility with some organic low-K dielectrics. Thus, barriers are needed to enable copper metallization both in terms of providing good adhesion for the copper film and allowing lower temperatures for deposition for reduced thermal budget processing without increased resistivity.

Figure 1A:
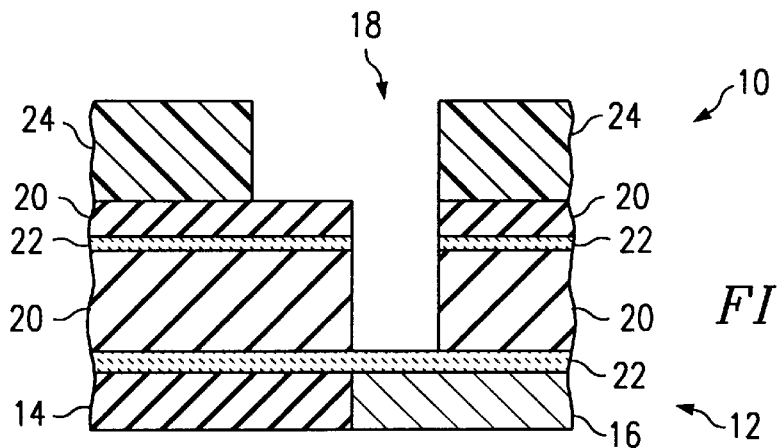
FIG. 1A depicts a side cutaway view of a microelectronic device having high-aspect-ratio feature.

Referring now to FIG. 1A, a device 10 formed on a substrate layer 12 having an oxide portion 14 and a copper portion 16. Device 10 includes a high-aspect-ratio feature 18 etched in oxide layers 20. Oxide layers 20 are separated by etch stop layers 22, and have metal resist layers 24 deposited on the upper most oxide layer 20. Device 10 is prepared for the second etch treatment of a dual damascene fabrication technique.

Figure 1B:
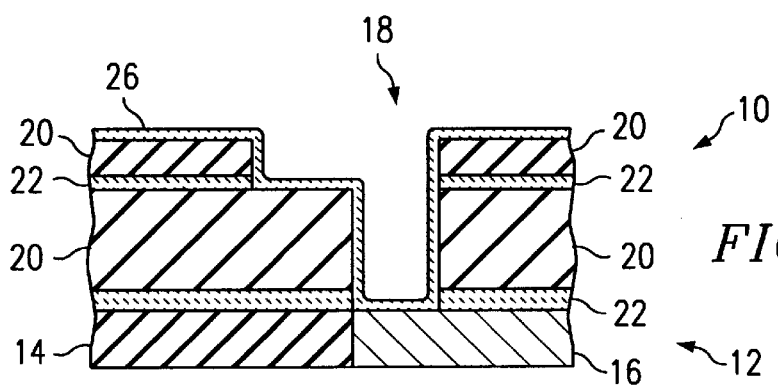
FIG. 1B depicts a side cutaway view of a microelectronic device having high-aspect-ratio feature with a barrier.
Figure 1C:
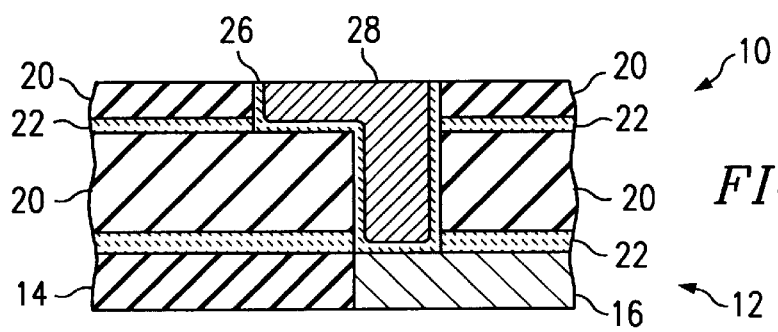
FIG. 1C depicts a side cutaway view of a microelectronic device having high-aspect-ratio feature with copper deposited on the barrier within the feature.

Device 10 of FIG. 1A is treated to etch top oxide layer 20, resulting in the formation of a via and plug formation 18 depicted by FIG. 1B. A barrier layer 26 is then deposited on device 10. Deposition of barrier layer 26 using CVD or MOCVD provides uniform layer thicknesses along the side wall and bottom of feature 18 to isolate oxide layers 20. Device 10 is then in a condition to accept deposition of copper to fill feature 18. FIG. 1C depicts copper 28 deposited within feature 18. Barrier layer 26 separates the underlying substrate 12 and oxide layers 20 from the overlying copper layer 28 to prevent diffusion of copper layer 28 into substrate 12 and oxide layers 20. If copper layer 28 were allowed to directly contact oxide within any oxide layer 20, this could result in device performance and reliability degradation as copper diffused through the oxide layer 20. However, if barrier layer 26 is conducting with minimal resistivity, copper layer 16 of substrate 12 and the deposited copper layer 28 will have good electrical conductivity. Once copper layer 28 is deposited, chemical mechanical polishing is used to smooth the upper surface of device 10. Although FIG. 1C depicts a copper layer 28 as deposited on barrier 26, it is important to note that the present invention provides a barrier to separate or encapsulate other conventional metallization material layers, such as aluminum and tungsten.

Copper metallization presents particular difficulties in terms of maintaining effective separation of copper material from a substrate or other underlying dielectric material. Non-conducting barriers based on oxide or nitride insulators, such as Si3N4, provide passivation and prevent copper diffusion due to their amorphous structures. However, most barrier applications for microelectronic devices require a conducting barrier Electrically conducting barriers that include silicon, such as TiSiN, TaSiN and WSiN, or that include boron, such as WBN, can succeed at limiting copper diffusion but have relatively high resistivity values (e.g., $P >> 1000$ $\mu\Omega.cm$). Further, such barriers are generally deposited by physical-vapor deposition (PVD), limiting the step coverage and conformality available for these barriers and reducing their practicality as device dimensions shrink. In addition, the resistivity of these barriers increases to higher levels as the deposition temperature decreases below 380° C. for compatibility with certain low-K dielectrics. Also, these barriers generally have poor adhesion, limiting their usefulness, especially when chemical mechanical polishing (CMP) is needed for device fabrication, such as in single-damascene or dual-damascene copper metallization processes.

To obtain good adhesion and reduced deposition temperature, and, in some applications, to reduce the barrier resistivity, the present invention uses one or more dopants selected from the group of platinum, palladium, iridium, rhodium, and tin to dope barrier layer 26 and tailor barrier properties for copper metallization. Some dopants can render the barrier amorphous or nano-crystalline by disrupting the crystalline structure of other materials in the barrier, such as refractory metals selected from the group of tungsten, titanium, tantalum, chromium and cobalt For example, the alloys Co91ZrTa and Co91ZrNb are amorphous even though Co is polycrystalline in its pure form. Other nitridizing, oxidizing, or carbonizing elements selected from the group of nitrogen, oxygen and carbon can also be included in the barrier, either as an intentional controlled addition to obtain desired barrier properties or as impurities resulting from the deposition process, particularly CVD processes.

Doping the barrier with an appropriate dopant element provides a number of advantages. For instance, a suitable dopant, such as Pt, enhances nucleation and adhesion to support MOCVD deposition of an overlying copper film. A suitable dopant, such as Pt, also reduces resistivity of the barrier, such as MOCVD TaN layers, particularly with CVD deposited barriers. Low barrier resistance, such as less than 500, $\mu\Omega$.cm provide desirable low via plug resistance (e.g., R<1$\Omega$). Further, by rendering the barrier amorphous or nano-crystalline through disruption of the crystalline structure, the dopant provides passivation and prevents metallic diffusion between metallization layers.

Platinum is one example of a dopant, the addition of which to a barrier, such as MOCVD TaN, decreases the resistivity at low deposition temperatures. Platinum has low diffusivity in tantalum, provides a good nucleation surface for CVD copper deposition, and improves adhesion of as-deposited MOCVD copper to the barrier for reliable chemical-mechanical polishing (CMP).

Platinum enhances adhesion of copper to a barrier by reducing interfacial contamination formed during initiation of CVD copper. Copper deposition with Cu(I) precursors such as Cupraselect (Cu-hfac-tmvs) supplied by Schumacher, proceeds through adsorption of the precursor and subsequent disproportionation reaction. A parallel reaction pathway is adsorption and ligand (hfac) decomposition, resulting in interfacial contamination at the barrier/copper interface. The rate of ligand decomposition depends upon the nature of the barrier surface accepting the initial copper film. Both copper and platinum surfaces adsorb the hfac ligand in a "standing up" mode with the hfac skeleton normal to the substrate surface. On other materials, the hfac ligand is adsorbed in a lying down mode that decomposes at 190K, compared with decomposition at 350K for standing up ligand on copper and 300K on platinum. Uniform nucleation and adhesion occur on both copper and platinum because the rate for disproportionation exceeds the rate for ligand decomposition. In other words, the precursor has reacted via disproportionation before ligand decomposition and interface contamination can occur. With most materials other than copper and platinum, the threshold temperature for ligand decomposition is much lower, and the rate of ligand decomposition exceeds the rate of disproportionation leading to interface contamination at the barrier/copper interface. Platinum containing alloys such as $Co_{80}Pt_{20}$, $Co_{82}Cr_8Pt_{10}$, and $Co_{75}Cr_{13}Pt_{12}$ also provide good adhesion for a subsequent copper metal layer, suggesting that platinum contained in a material matrix can actually be at least as effective as a continuous platinum layer. Thus, doping of conventional barrier materials such as TaN, TiN and WN with platinum can enhance the barrier properties provided through resistivity reduction and enhancement of MOCVD copper adhesion.

One conventional method for CVD of a barrier layer is thermal decomposition/thermolysis of a metal-containing precursor in an inert (Ar, He) or reducing (NH3, H2) ambient. Such deposition typically results in some level of carbon incorporation in the barrier material since many of the reaction byproducts have low volatility when metal-organic precursors are used. Carbon incorporation can lead to high barrier resistivity and sometimes unstable time-dependent barrier properties, and is generally reduced by post-deposition treatment, such as plasma treatment or thermal annealing, to remove the most volatile constituents and densify the barrier film.

One method for reducing carbon incorporation into the barrier is co-deposition of the barrier precursor and a platinum-containing precursor in an H2 ambient. Platinum has catalytic qualities to encourage the hydrogenation of barrier precursor ligands to their volatile forms, leading to a platinum doped barrier with low carbon content and deposition temperature reduction (e.g., between 10° and 30° C.). The lower deposition temperatures associated with a platinum dopant better enable integration of low-k dielectrics and improvement in step coverage. Commercial grade platinum precursors, such as MeCpPtMe3 support easy disassociation of the Pt-C bond in an H2 ambient, increasing the purity of the deposited platinum and reducing the resistivity of the composite barrier, such as TaNPt.

Figure 2:
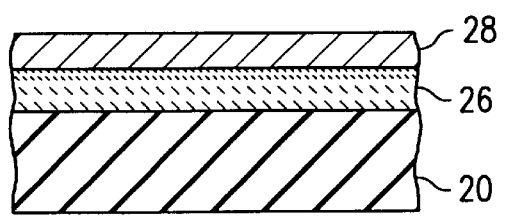
FIG. 2 depicts a side cutaway view of a barrier having a platinum dopant with increasing platinum density at the overlying interconnect interface compared to the underlying substrate interface.

Referring now to FIG. 2, a platinum-containing barrier layer 26 is depicted between an underlying substrate oxide layer 20 and an overlying copper layer 28. Barrier layer 26 has a graded composition through its thickness that contains a greater proportion of platinum adjacent to copper layer 28 than is contained adjacent to oxide layer 20. For example, barrier layer 26 could consist of a TaPtN barrier that is more platinum rich adjacent to the copper layer to provide a good nucleation and adhesion surface for copper deposition, and that is platinum deficient, with reduced Pt doping in the bulk of barrier layer 26 to retain optimal barrier properties. Varied concentrations of platinum through the thickness of barrier layer 26 can be achieved through co-deposition of platinum with barrier materials, such as TiN and TaN and WN, with the deposition rate of platinum increasing as barrier 26 is deposited. Co-deposition techniques are discussed in greater detail. in U.S. patent application Ser. No. 09/113,852, entitled "Method for Forming a Copper Film on a Substrate", by Paranjpe et al., which is incorporated herein by reference.

Although platinum provides many advantages as a dopant, other dopants and combinations of dopants can be used to optimize barrier qualities. In general, barriers according to the present invention can be represented by the formula:

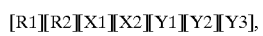

[R1][R2][X1][X2][Y1][Y2][Y3], where R represents a refractory metal selected from the group of tantalum, tungsten, titanium, chromium, and cobalt; X represents a dopant selected from the group of platinum, palladium, iridium, rhodium, and tin; and Y represents an element select from the group of nitrogen, oxygen and carbon. As a minimum, the barrier comprises at least one refractory metal and one dopant. The barrier can also comprise between zero and two refractory metals, and between zero and three of the other elements from the Y group. The table below depicts a number of barrier materials according to the present invention, methods for deposition of the barrier and properties and some properties associated with each barrier material:

| ID | Interconnect Barrier Material (Deposition Methods) | Properties and Impact |
|---|---|---|
| 1 | $Ta_xN_yPt_z$ (plasma PVD, MOCVD, L-MOCVD, PECVD, vacuum arc PVD, IBD) | Good barrier for Cu; Pt content for CMP-proof adhesion of MOCVD-Cu; lower resistivity than TaN due to Pt |
| 2 | $Ta_xSn_yN_z$ (plasma PVD, MOCVD, PECVD, vacuum arc PVD, IBD) | Lower resistivity than TaSiN due to Sn instead of Si; near amorphous microstructure for excellent barrier properties |
| 3 | $Ti_xSn_yN_z$ (plasma PVD, MOCVD, PECVD, vacuum arc PVD, IBD) | Lower resistivity than TiSiN due to Sn instead of Si; near amorphous microstructure for excellent barrier properties |
| 4 | $Ti_xSn_yN_zP_w$ (plasma PVD, MOCVD, PECVD, vacuum arc PVD, IBD) | Good CMP-proof copper adhesion; near-amorphous microstructure for good barrier; lower resistivity due to Pt |
| 5 | $Cr_xC_yPt_z$ (plasma PVD, MOCVD, PECVD, vacuum arc PVD, IBD) | Good barrier for Cu; good CMP-proof MOCVD-Cu adhesion due to Pt; lower resistivity than CrC due to Pt |
| 6 | $Cr_xCo_yPt_z$ (plasma PVD, MOCVD, PECVD, vacuum arc PVD, IBD) | Good diffusion barrier for Cu; excellent CMP-proof MOCVD-Cu adhesion due to Pt |
| 7 | $Co_xPt_y$ (plasma PVD, MOCVD, PECVD, vacuum arc PVD, IBD) | Good diffusion barrier for Cu; excellent CMP-proof MOCVD-Cu adhesion due to Pt |
| 8 | $Ta_xPt_y$ (plasma PVD, MOCVD, PECVD, vacuum arc PVD, IPD) | Superior MOCVD-Cu adhesion compared to Ta barrier; good diffusion barrier properties |
| 9 | $W_xN_yPt_z$ (plasma PVD, MOCVD, PECVD, vacuum arc PVD, IBD) | Superior barrier to WN for CMP-proof adhesion of MOCVD-Cu; lower resistivity barrier |
| 10 | $Ta_xSn_yN_zPt_w$ (plasma PVD, MOCVD, PECVD, vacuum arc PVD, IBD) | Good CMP-proof adhesion of MOCVD-Cu; near-amorphous material for good barrier properties; low resistivity due to Pt and Sn |
| 11 | $W_xSn_yN_z$ (plasma PVD, MOCVD, PECVD, vacuum arc PVD, IBD) | Good ternary barrier properties due to near-amorphous microstructure; lower resistivity than WSiN due to Sn |
| 12 | $W_xSn_yN_zPt_w$ (plasma PVD, MOCVD, PECVD, vacuum arc PVD, IBD) | Good CMP-proof adhesion of MOCVD-Cu; near-amorphous microstructure for good barrier; lower resistivity than WSiN |

Following the deposition, the barrier surface may be treated, such as by thermal annealing or plasma treatment, to selectively passivate some of the surface elements. For example, for a TaPt barrier, a thermal or plasma oxidation following deposition will passivate the Ta without affecting the Pt. Thus, the barrier surface would behave more as a Pt surface than a TaPt surface with respect to subsequent metalization. This advantageously enhances adhesion, particularly for copper overlayers.

Although the present invention has been described in detail, it should be understood that various changes, substitutions and alterations can be made hereto without departing from the spirit and scope of the invention as defined by the appended claims.

What is claimed is:

1. A microelectronic semiconductor interconnect structure formed on a substrate, the interconnect structure comprising:
   a trench feature fabricated in the substrate;
   a barrier conformally deposited on the side walls and bottom of the trench, the barrier layer comprising $Ta_xSn_yN_z$; and
   an overlying metallization layer deposited over the barrier layer within the trench.

2. A microelectronic semiconductor interconnect structure formed on a substrate, the interconnect structure comprising:
   a trench feature fabricated in the substrate;
   a barrier conformally deposited on the side walls and bottom of the trench, the barrier layer comprising $Ti_xSn_yN_z$; and
   an overlying metallization layer deposited over the barrier layer within the trench.

3. A microelectronic semiconductor interconnect structure formed on a substrate, the interconnect structure comprising:
   a trench feature fabricated in the substrate;
   a barrier conformally deposited on the side walls and bottom of the trench, the barrier layer comprising $W_xSn_yN_z$; and
   an overlying metallization layer deposited over the barrier layer within the trench.

4. A microelectronic semiconductor interconnect structure formed on a substrate, the interconnect structure comprising:
   a trench feature fabricated in the substrate;
   a barrier conformally deposited on the side walls and bottom of the trench, the barrier layer comprising the elements [R][X1][X2][Y] wherein:
   [R] is a refractory metal selected from the group consisting of Ta, W, Ti, Cr, and Co;
   X1 is a first dopant selected from the group of Pt, Pd, Ir, Rh, and Sn;
   X2 is a second dopant selected from the group of Pt, Pd, Ir, Rh, and Sn
   [Y] is an element selected from the group consisting of C, O, N; and
   an overlying metallization layer deposited over the barrier layer within the trench.

5. The interconnect structure according to claim 4 wherein the barrier comprises $Ti_xSn_yN_zPt_w$.

6. The interconnect structure according to claim 4 wherein the barrier comprises $Ta_xSn_yN_zPt_w$.

7. The interconnect structure according to claim 4 wherein the barrier comprises $W_xSn_yN_zPt_w$.

8. A microelectronic semiconductor interconnect structure formed on a substrate, the interconnect structure comprising:
   a barrier comprising the elements [R][X][Y] wherein:
   [R] is a refractory metal of Ti;
   [X] is a dopant of Sn; and
   [Y] is an element of N.

9. A microelectronic semiconductor interconnect structure formed on a substrate, the interconnect structure comprising:
   a barrier comprising the elements [R][X][Y] wherein:
   [R] is a refractory metal of W;
   [X] is a dopant of Sn; and
   [Y] is an element of N.

10. A microelectronic semiconductor interconnect structure formed on a substrate, the interconnect structure comprising:

a barrier comprising the elements [R][X1][X2][Y] wherein:
   [R] is a refractory metal of Ti;
   [X1] is a first dopant selected from the group consisting of Pt, Pd, Ir, Rh, and Sn;
   [X2] is a second dopant selected from the group consisting of Pt, Pd, Ir, Rh, and Sn; and
   [Y] is an element of N.

11. The device according to claim 10 wherein the barrier comprises $Ti_xSn_yN_zPt_w$.

12. The device according to claim 10 wherein the barrier comprises $Ta_xSn_yN_zPt_w$.

13. The device according to claim 10 wherein the barrier comprises $W_xSn_yN_zPt_w$.

14. The device according to claim 10 wherein the interconnect structure further comprises a copper overlayer deposited on the barrier.

* * * * *